United States Patent
Shirako et al.

(10) Patent No.: US 12,489,010 B2
(45) Date of Patent: Dec. 2, 2025

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventors: Kenji Shirako, Toyama (JP); Tomoshi Taniyama, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 414 days.

(21) Appl. No.: 17/463,300

(22) Filed: Aug. 31, 2021

(65) Prior Publication Data
US 2022/0068687 A1  Mar. 3, 2022

Related U.S. Application Data

(63) Continuation of application No. PCT/JP2019/012283, filed on Mar. 22, 2019.

(51) Int. Cl.
*H01L 21/677* (2006.01)
*H01L 21/673* (2006.01)
*H01L 21/68* (2006.01)

(52) U.S. Cl.
CPC .. *H01L 21/67778* (2013.01); *H01L 21/67303* (2013.01); *H01L 21/6735* (2013.01); *H01L 21/67757* (2013.01); *H01L 21/68* (2013.01)

(58) Field of Classification Search
CPC ......... H01L 21/67303; H01L 21/67778; H01L 21/67757
See application file for complete search history.

(56) References Cited

U.S. PATENT DOCUMENTS 5,697,749 A * 12/1997 Iwabuchi .......... H01L 21/67781
                                                414/217
2005/0187647 A1* 8/2005 Wang ................. H01L 21/67757
                                                700/100
(Continued)

FOREIGN PATENT DOCUMENTS

JP        06-283502 A      10/1994
JP      10256341 A *      9/1998
(Continued)

OTHER PUBLICATIONS

Singapore Written Opinion issued on Jul. 19, 2023 for Singapore Patent Application No. 11202109509Q.
(Continued)

*Primary Examiner* — Gerald McClain
(74) *Attorney, Agent, or Firm* — Volpe Koenig

(57) ABSTRACT

A substrate processing apparatus includes a boat including plural slots to hold at least one substrate, a process furnace that processes the at least one substrate held in the boat, a boat elevator that raises and lowers the boat, a transfer device that transfers the at least one substrate between plural carriers where the at least one substrate is stored and the boat, and a controller capable of controlling the boat elevator and the transfer device, wherein the controller sets plural positions where the transfer device transfers the at least one substrate to the boat elevator, and select the positions to minimize a number of shifts among the positions of the boat elevator or total time taken during the shifts.

19 Claims, 10 Drawing Sheets

(56) References Cited

U.S. PATENT DOCUMENTS

2012/0269603 A1   10/2012  Toba
2013/0028687 A1    1/2013  Takahashi et al.
2019/0067055 A1*  2/2019  Zheng ............... H01L 21/67754

FOREIGN PATENT DOCUMENTS

| JP | 2003-163252 A | 6/2003 |
| JP | 2009-088349 A | 4/2009 |
| JP | 4886669 B | 2/2012 |
| KR | 10-2012-0120052 A | 11/2012 |
| KR | 10-2013-0014406 A | 2/2013 |

OTHER PUBLICATIONS

Korean Office Action issued on Jun. 7, 2023 for Korean Patent Application No. 10-2021-7027673.
International Search Report, PCT/JP2019/012283, Apr. 16, 2019 (4 pgs.).
Korean Office Action issued on Jun. 11, 2024 for Korean Patent Application No. 10-2021-7027673.

* cited by examiner

FIG. 5

| Boat slot No. | Transfer area for each position | |
|---|---|---|
| 53 | | Second position HOME2 transfer prohibition area |
| 52 | | |
| 51 | | |
| 50 | | |
| 49 | | |
| 48 | | |
| 47 | | |
| 46 | First position HOME1 transfer area $A_1$ | |
| 45 | | |
| 44 | | |
| 43 | | Second position HOME2 transfer area $A_2$ |
| 42 | | |
| 41~16 | | |
| 15 | | |
| 14 | | |
| 13 | | |
| 12 | | |
| 11 | | |
| 10 | First position HOME1 transfer prohibition area | |
| 9 | | |
| 8 | | |
| 7 | | |
| 6 | | |
| 5 | | |
| 4 | | |
| 3 | | |
| 2 | | |
| 1 | | |

| BS No. | Carrier | CS No. | Transfer order |
|---|---|---|---|
| 53 | Dummy #1 | 01 | 1 |
| 52 | Monitor #1 | 01 | 51 |
| 51 | Fill Dummy #1 | 01 | 3 |
| ⋮ | ⋮ | ⋮ | ⋮ |
| 44 | Fill Dummy #1 | 08 | 10 |
| 43 | Product #1 | 01 | 18 |
| ⋮ | ⋮ | ⋮ | ⋮ |
| 28 | Product #1 | 16 | 33 |
| 27 | Monitor #1 | 02 | 52 |
| 26 | Product #1 | 17 | 34 |
| ⋮ | ⋮ | ⋮ | ⋮ |
| 18 | Product #1 | 25 | 42 |
| 17 | Product #2 | 01 | 43 |
| ⋮ | ⋮ | ⋮ | ⋮ |
| 10 | Product #2 | 08 | 50 |
| 9 | Fill Dummy #1 | 09 | 11 |
| ⋮ | ⋮ | ⋮ | ⋮ |
| 3 | Fill Dummy #1 | 15 | 17 |
| 2 | Monitor #1 | 03 | 53 |
| 1 | Dummy #1 | 02 | 2 |

| No. | H1 | H2 | Type of wafer |
|---|---|---|---|
| 53 | | | Dummy |
| 52 | | | Monitor |
| 51 | | | Fill Dummy |
| 50 | | | Fill Dummy |
| 49 | | | Fill Dummy |
| 48 | | | Fill Dummy |
| 47 | | | Fill Dummy |
| 46 | | | Fill Dummy |
| 45 | | | Fill Dummy |
| 44 | | | Fill Dummy |
| 43 | | | Product1 |
| 42 | | | Product1 |
| 41 | | | Product1 |
| 40 | | | Product1 |
| 39 | | | Product1 |
| 38 | | | Product1 |
| 37 | | | Product1 |
| 36 | | | Product1 |
| 35 | | | Product1 |
| 34 | | | Product1 |
| 33 | | | Product1 |
| 32 | | | Product1 |
| 31 | | | Product1 |
| 30 | | | Product1 |
| 29 | | | Product1 |
| 28 | | | Product1 |
| 27 | | | Monitor |
| 26 | | | Product1 |
| 25 | | | Product1 |
| 24 | | | Product1 |
| 23 | | | Product1 |
| 22 | | | Product1 |
| 21 | | | Product1 |
| 20 | | | Product1 |
| 19 | | | Product1 |
| 18 | | | Product1 |
| 17 | | | Product2 |
| 16 | | | Product2 |
| 15 | | | Product2 |
| 14 | | | Product2 |
| 13 | | | Product2 |
| 12 | | | Product2 |
| 11 | | | Product2 |
| 10 | | | Product2 |
| 9 | | | Fill Dummy |
| 8 | | | Fill Dummy |
| 7 | | | Fill Dummy |
| 6 | | | Fill Dummy |
| 5 | | | Fill Dummy |
| 4 | | | Fill Dummy |
| 3 | | | Fill Dummy |
| 2 | | | Monitor |
| 1 | | | Dummy |

▓ : Transferrable  ⊡ : Non-transferrable

[Wafer loading]  802

Transfer order :
Dummy⇒Fill Dummy⇒Product⇒Monitor

| Type of wafer | The number of operations | Transfer order |
|---|---|---|
| Dummy | 1 | 53⇒1 |
| Fill Dummy | 2 | ⇒51~44⇒9~3 |
| Product1 | 0 | 43~28, 26~18 |
| Product2 | 0 | 17~10 |
| Monitor | 2 | ⇒52, 27⇒2 |
| Total operation | 5 | |

[Wafer unloading]  803

Transfer order :
Monitor⇒Product⇒Fill Dummy⇒Dummy

| Type of wafer | The number of operations | Transfer order |
|---|---|---|
| Monitor | 2 | ⇒2⇒27, 52 |
| Product2 | 1 | ⇒10~17 |
| Product1 | 0 | 18~26, 28~43 |
| Fill Dummy | 1 | 3~9⇒44~51 |
| Dummy | 2 | ⇒1⇒53 |
| Total operation | 6 | |

| No. | H1 | H2 | Type of wafer |
|---|---|---|---|
| 53 | | | Dummy |
| 52 | | | Monitor |
| 51 | | | Fill Dummy |
| 50 | | | Fill Dummy |
| 49 | | | Fill Dummy |
| 48 | | | Fill Dummy |
| 47 | | | Fill Dummy |
| 46 | | | Fill Dummy |
| 45 | | | Fill Dummy |
| 44 | | | Fill Dummy |
| 43 | | | Product1 |
| 42 | | | Product1 |
| 41 | | | Product1 |
| 40 | | | Product1 |
| 39 | | | Product1 |
| 38 | | | Product1 |
| 37 | | | Product1 |
| 36 | | | Product1 |
| 35 | | | Product1 |
| 34 | | | Product1 |
| 33 | | | Product1 |
| 32 | | | Product1 |
| 31 | | | Product1 |
| 30 | | | Product1 |
| 29 | | | Product1 |
| 28 | | | Product1 |
| 27 | | | Monitor |
| 26 | | | Product1 |
| 25 | | | Product1 |
| 24 | | | Product1 |
| 23 | | | Product1 |
| 22 | | | Product1 |
| 21 | | | Product1 |
| 20 | | | Product1 |
| 19 | | | Product1 |
| 18 | | | Product1 |
| 17 | | | Product2 |
| 16 | | | Product2 |
| 15 | | | Product2 |
| 14 | | | Product2 |
| 13 | | | Product2 |
| 12 | | | Product2 |
| 11 | | | Product2 |
| 10 | | | Product2 |
| 9 | | | Fill Dummy |
| 8 | | | Fill Dummy |
| 7 | | | Fill Dummy |
| 6 | | | Fill Dummy |
| 5 | | | Fill Dummy |
| 4 | | | Fill Dummy |
| 3 | | | Fill Dummy |
| 2 | | | Monitor |
| 1 | | | Dummy |

▨ : Transferrable  ◨ : Non-transferrable

902

[Wafer loading]

Transfer order :
Dummy⇒Fill Dummy⇒Product⇒Monitor

| Type of wafer | The number of operations | Transfer order |
|---|---|---|
| Dummy | 1 | 53⇒1 |
| Fill Dummy | 2 | ⇒51~44⇒9~3 |
| Product1 | 1 | ⇒43~28, 26~18 |
| Product2 | 1 | 17~11⇒10 |
| Monitor | 2 | ⇒52, 27⇒2 |
| Total operation | 7 | |

903

[Wafer unloading]

Transfer order :
Monitor⇒Product⇒Fill Dummy⇒Dummy

| Type of wafer | The number of operations | Transfer order |
|---|---|---|
| Monitor | 2 | ⇒2⇒27, 52 |
| Product2 | 2 | ⇒10⇒11~17 |
| Product1 | 0 | 18~26, 28~43 |
| Fill Dummy | 2 | ⇒3~9⇒44~51 |
| Dummy | 2 | ⇒1⇒53 |
| Total operation | 8 | |

SUBSTRATE PROCESSING APPARATUS AND METHOD OF MANUFACTURING SEMICONDUCTOR DEVICE

CROSS-REFERENCE TO RELATED APPLICATION

The application is a Bypass Continuation Application of PCT International Application No. PCT/JP2019/012283, filed on Mar. 22, 2019 and designating the United States, the disclosure of which is incorporated herein in its entirety by reference.

TECHNICAL FIELD

The present disclosure relates to a substrate processing apparatus and a method of manufacturing a semiconductor device.

BACKGROUND

In the related art, there is disclosed a substrate processing apparatus including a process tube in which a plurality of wafers held by a boat are processed, a load lock chamber where the boat is loaded or unloaded directly under the process tube, a boat elevator that is installed in a standby part of the load lock chamber and raises and lowers the boat, a vacuum preliminary chamber that is consecutively connected to the load lock chamber and is opened and closed by a gate valve, and a wafer transfer device that is installed in an installation part of the load lock chamber and transfers wafers between the boat and the vacuum preliminary chamber, and the substrate processing apparatus is configured such that a stroke $L_1$ of the wafer transfer device in a vertical direction is set to be smaller than a wafer holding range $L_2$ of the boat and a stroke shortage $L_3$ is supplemented by a stroke of the boat elevator. In this way, by supplementing the stroke shortage of the wafer transfer device with the stroke of the boat elevator, the stroke of the wafer transfer device may be set to be short, thereby reducing a volume of an airtight chamber in which the wafer transfer device is installed, and furthermore, shortening a vacuuming time to improve a throughput.

SUMMARY

Some embodiments of the present disclosure provide a technique capable of efficiently loading or unloading a wafer into or from a boat.

According to embodiments of the present disclosure, there is provided a technique that includes: a boat including a plurality of slots configured to hold at least one substrate; a process furnace configured to process the at least one substrate held in the boat; a boat elevator configured to raise and lower the boat; a transfer device configured to transfer the at least one substrate between a plurality of carriers in which the at least one substrate is stored and the boat; and a controller configured to be capable of controlling the boat elevator and the transfer device, wherein the controller is configured to set a plurality of positions at which the transfer device transfers the at least one substrate to the boat elevator, and perform a selection of the plurality of positions to minimize a number of shifts among the plurality of positions of the boat elevator or a total time taken during the shifts in each of an operation of the transfer device to load the at least one substrate into the boat until the at least one substrate is loadable into the process furnace from the plurality of carriers and an operation of the transfer device to unload the at least one substrate processed in the process furnace from the boat to the plurality of carriers.

Other novel features of the present disclosure will become apparent from the following description and the accompanying drawings herein.

BRIEF DESCRIPTION OF DRAWINGS

FIG. 5 is a diagram showing wafer transfer areas at a first position HOME1 and a second position HOME2.

FIG. 7 is an example of substrate transfer information.

FIG. 8 is an example of transfer order in embodiments of the present disclosure.

FIG. 9 is an example of transfer order in a comparative example.

DETAILED DESCRIPTION (Overview of Substrate Processing Apparatus)

Embodiments of the present disclosure will be described with reference to FIGS. 1 and 2. In the embodiments of the present disclosure, a substrate processing apparatus is, for example, a substrate processing apparatus that performs a process in the manufacture of a semiconductor device (IC). In the following description, an example of an apparatus of a vertical type (hereinafter also simply referred to as a processing apparatus) that performs oxidation, diffusion process, CVD process, and the like on a substrate (wafer) as a substrate processing apparatus will be described.

Figure 1:
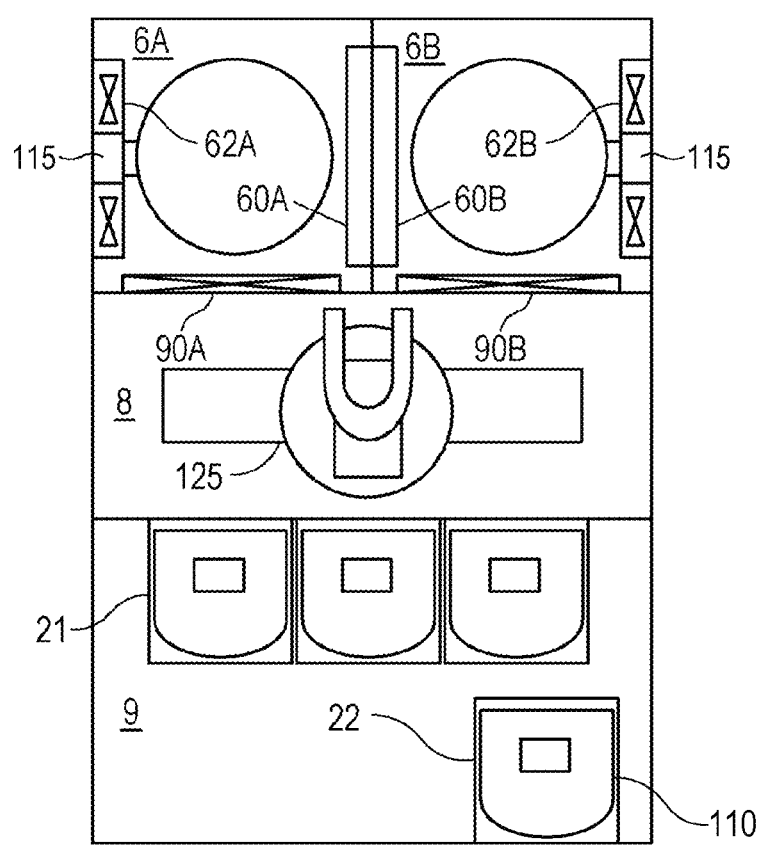
FIG. 1 is an example of a cross-sectional view of a substrate processing apparatus.
Figure 2:
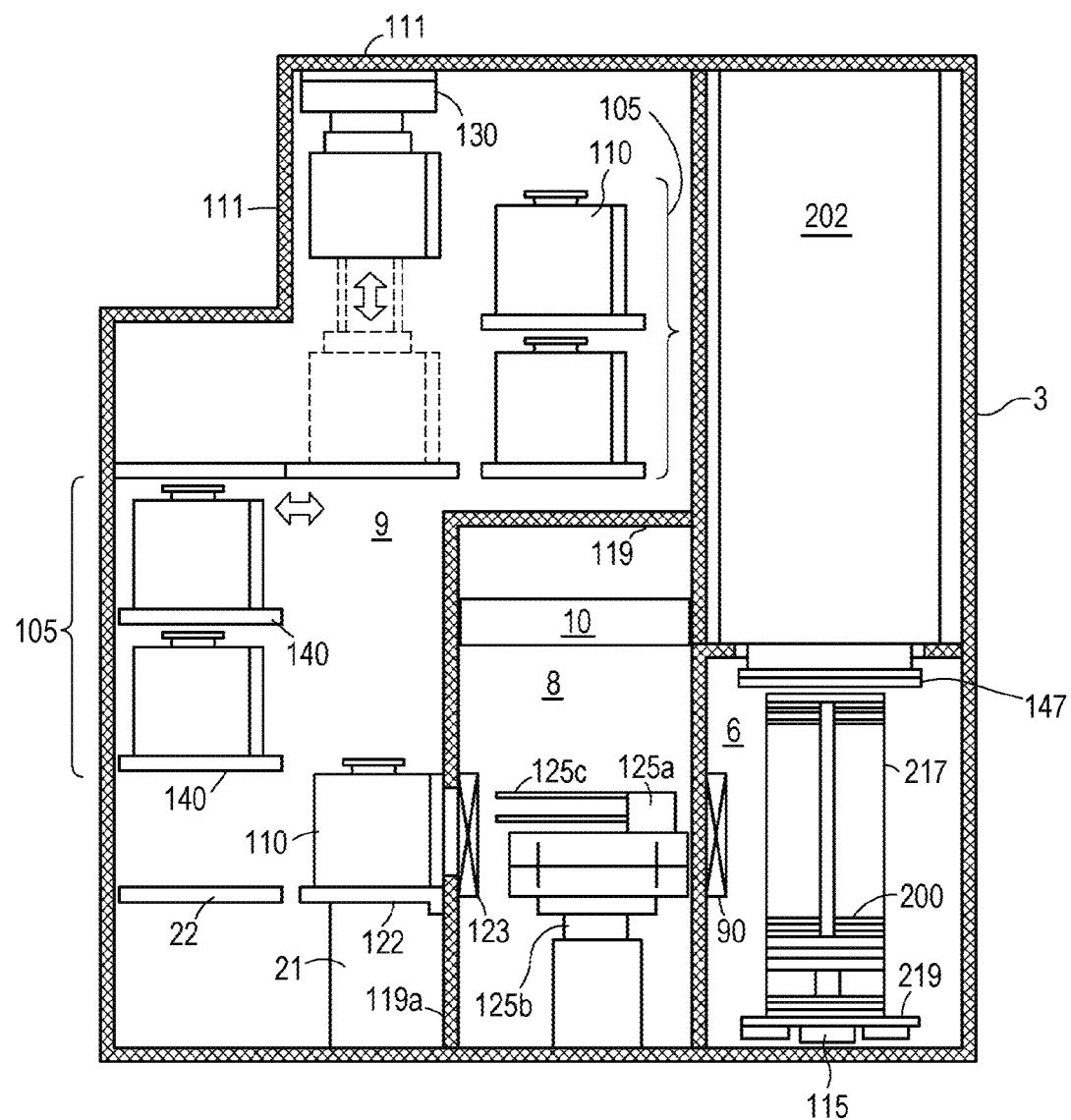
FIG. 2 is an example of a longitudinal sectional view of a substrate processing apparatus.

As shown in FIGS. 1 and 2, the substrate processing apparatus includes two adjacent process modules (PMs) 3A and 3B. The process modules 3A and 3B include vertical process furnaces 202A and 202B configured to process a plurality of wafers (substrates) 200 collectively on the upper side thereof, respectively. For example, one process furnace is capable of processing about 5 to 250 (specifically 25 to 75) wafers 200.

The process modules 3A and 3B include charging chambers (loading areas) 6A and 6B as preparation chambers arranged below the process furnaces 202A and 202B, respectively. A transfer chamber (for example, EFEM: Equipment Front End Module) 8 including a wafer transfer mechanism 125 as a transfer device configured to transfer the wafers 200 is disposed adjacent to the charging chambers 6A and 6B on the front side of the charging chambers 6A and 6B.

A storage chamber (stocker) 9 configured to store a pod (FOUP: Front Opening Unified Pod) 110 as a storage container (carrier) configured to accommodate a plurality of wafers 200 is installed on the front side of the transfer chamber 8. A load port 22 as an I/O port is installed on the front surface of the storage chamber 9, and the pod 110 is load and unloaded into and from the processing apparatus via the load port 22. The pod 110 is provided with 25 holding portions (hereinafter also referred to as slots) on which the wafers 200 are placed.

Gate doors 90A and 90B as isolation parts are installed at a boundary wall (adjacent surface) between the charging chambers 6A and 6B and the transfer chamber 8. Pressure detectors are installed in the transfer chamber 8 and the charging chambers 6A and 6B, respectively, and an internal pressure of the transfer chamber 8 is set to be lower than internal pressures of the charging chambers 6A and 6B. Further, oxygen concentration detectors are installed in the transfer chamber 8 and the charging chambers 6A and 6B, respectively, and oxygen concentrations in the transfer chamber 8A and the charging chambers 6A and 6B are maintained lower than an oxygen concentration in the atmosphere. Preferably, they are maintained at 30 ppm or less.

A clean unit 10 configured to supply a clean atmosphere into the transfer chamber 8 is installed at a ceiling portion of the transfer chamber 8 to circulate the clean atmosphere, for example, an inert gas, in the transfer chamber 8. By circulation-purging an interior of the transfer chamber 8 with the inert gas having a positive pressure, it is possible to prevent particles and the like of the charging chambers 6A and 6B in the transfer chamber 8 from being mixed into the process furnace 202, and it is possible to prevent a natural oxide film or the like from being formed on the wafers 200 in the transfer chamber 8 and the charging chambers 6A and 6B.

A plurality of pod openers (for example, FIMS: Front-opening Interface Mechanical Standard) 21, for example, 3 pod openers, configured to open and close a lid of the pod 110 are installed at a boundary wall between the storage chamber 9 and the transfer chamber 8 behind the storage chamber 9. When each of the pod openers 21 opens the lid of the pod 110, the wafer 200 in the pod 110 is loaded and unloaded into and from the transfer chamber 8.

As shown in FIG. 2, a housing 111 of a body of the substrate processing apparatus is installed to surround the process modules 3A and 3B, the transfer chamber 8, and the storage chamber 9. A sub-housing 119 defines the transfer chamber 8 in the housing 111. The front of the housing 111 is on the side of the storage chamber 9.

A pod loading and unloading port is installed at the side of a surface of the storage chamber 9 such that the inside and the outside of the housing 111 communicate with each other. The pod loading and unloading port may be configured to be opened and closed by a front shutter (not shown).

A load port 22 used as a loading and unloading part is installed at the pod loading and unloading port, and the load port 22 is configured such that the pod 110 is placed and aligned. The pod 110 is loaded onto the load port 22 by an in-process transfer device and is also unloaded from the load port 22.

Pod shelves (storage shelves) 105 are installed in the form of a matrix in the vertical and horizontal directions near the front of the storage chamber 9 and above the transfer chamber 8. Each pod shelf 105 includes a plurality of mounting parts (trays) 140 on which the pods 110 are mounted respectively, and a horizontal movement mechanism (storage shelf horizontal movement mechanism) configured to horizontally move the mounting parts 140 individually between a storage position where the pod 110 is stored and a delivery position where the pod 110 is delivered. One stage of pod shelf 105 is constituted by the plurality of independent mounting parts 140 arranged in a row in the horizontal direction, and a plurality of stages of pod shelves of the one stage are installed in the vertical direction. Each mounting part 140 may be moved horizontally in an independent manner. A pod transfer device 130 is configured to transfer the pod 110 among the load port 22, the pod shelf 105, and the pod opener 21.

Three wafer loading and unloading ports configured to load and unload the wafer 200 into and from the sub-housing 119 are horizontally arranged side by side at a front wall 119a of the sub-housing 119, and the pod openers 21 are installed at the wafer loading and unloading ports, respectively. The pod opener 21 includes a mounting stand 122 on which the pod 110 is mounted, and a cap attachment and detachment mechanism 123 configured to attach and detach a cap of the pod 110 used as a seal. The pod opener 21 is configured to open and close a wafer entrance of the pod 110 by attaching and detaching the cap of the pod 110 mounted on the mounting stand 122 by the cap attachment and detachment mechanism 123. Further, the mounting stand 122 may be regarded as one of the plurality of mounting parts 140.

The sub-housing 119 constitutes the transfer chamber 8 that is fluidly isolated from the storage chamber 9 where the pod is transferred. The wafer transfer mechanism 125 installed in the transfer chamber 8 includes a transfer arm 125a configured to move the wafer 200 in the horizontal direction, a wafer transfer elevator 125b configured to raise and lower the transfer arm 125a, and an end effector (substrate holder) 125c that is installed at a lead end of the transfer arm 125a to hold the wafer 200. The wafer 200 is loaded (charged) and unloaded (discharged) into and from a boat 217 via the gate door 90 by continuous operation of the transfer elevator 125b and the transfer arm 125a.

The charging chamber 6 where the boat 217 unloaded from the process furnace 202 is accommodated and stands by is configured at a rear area of the transfer chamber 8. The gate door 90 installed at a rear surface of the transfer chamber 8 or a front surface of the charging chamber 6 slides up and down to be opened and closed, and the charging chamber 6 has a height which is at least twice the height of the gate door sliding up and down. The process furnace 202 in which the process chamber configured is installed above the charging chamber 6. The lower end of the process furnace 202 is configured to be closed by a furnace opening shutter 147 while the boat 217 being lowered.

The boat 217 is raised and lowered by a boat elevator 115 and is introduced into the process furnace. A seal cap 219 serving as a lid is horizontally installed at a connecting member (not shown) connected to an elevating stand of the boat elevator 115, and the lid 219 is configured to be capable of vertically supporting the boat 217 to close the lower end portion of the process furnace 202. The boat 217 includes a plurality of reinforcing members and is configured to hold a plurality of wafers 200 horizontally in such a state that the wafers 200 are arranged along the vertical direction with centers of the wafers 200 aligned with one another.

Next, operation of the substrate processing apparatus will be described. The description will be given with an example of performing substrate processing as a process of manufacturing a semiconductor device by using the above-described substrate processing apparatus. In the embodiments, when a sequence recipe is executed, a controller 121 controls operations of the respective parts constituting the substrate processing apparatus to start the substrate processing.

When the pod 110 is supplied to the load port 22, the pod 110 on the load port 22 is loaded from the pod loading and unloading port into the housing 111 by a pod loading device. The loaded pod 110 is automatically transferred and delivered to and temporarily stored in a designated mounting part 140 of the pod shelf 105 by the pod transfer device 130, and then, the stored pod 110 is transferred and delivered from the pod shelf 105 to one pod opener 21 and is then transferred onto the mounting stand 122, or is directly transferred to the pod opener 21 and is transferred onto the mounting stand 122.

An opening-side end face of the pod 110 mounted on the mounting stand 122 is pressed against an opening edge of the wafer loading and unloading port on the front wall 119a of the sub-housing 119, and the cap of the pod 110 is detached by the cap attachment and detachment mechanism 123 to open the wafer entrance. When the pod 110 is opened by the pod opener 21, the wafer 200 is held from the pod 110 by the end effector 125c via the wafer entrance, is loaded into the charging chamber 6 behind the transfer chamber 8 via the gate door 90, and is then charged into the boat 217. The transfer arm 125a that has delivered the wafer 200 to the boat 217 returns to the pod 110 and charges the next wafer 200 into the boat 217.

When a predetermined number of wafers 200 are charged into the boat 217, a pre-process is executed subsequently, and when the pre-process is completed, a main process (process recipe herein) is executed. When this process recipe is started, the lower end portion of the process furnace 202, which has been closed by the furnace opening shutter 147, is opened by the furnace opening shutter 147. Subsequently, the boat 217 holding a group of the wafers 200 is loaded into the process furnace 202 as the seal cap 219 is raised by the boat elevator 115.

After the loading, an arbitrary process is performed on the wafers 200 in the process furnace 202. After the process, the wafers 200 and the pod 110 are unloaded out of the housing in an order which is substantially reverse to the above-described order.

(Configuration of Controller)

Figure 3:
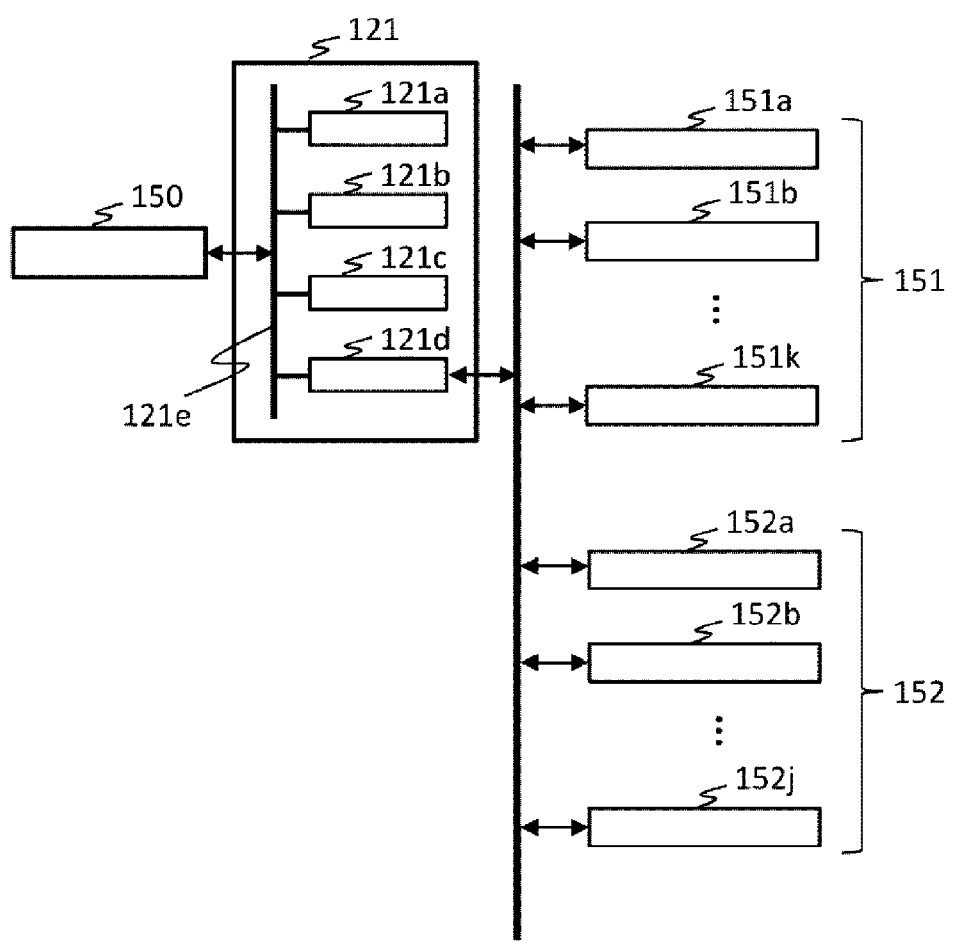
FIG. 3 is a block diagram of a controller.

As shown in FIG. 3, the controller 121, which is a control part (control means), is configured as a computer including a central processing unit (CPU) 121a as an execution part, a random access memory (RAM) 121b, a memory 121c as a storage part, and an I/O port 121d. The RAM 121b, which is configured as a memory area (work area) in which programs, data, and the like read by the CPU 121a are temporarily stored, the memory 121c, and the I/O port 121d are configured to be capable of exchanging data with the CPU 121a via an internal bus 121e. An input/output device 150 as an operation part configured as, for example, a touch panel or the like, is connected to the controller 121.

The memory 121c includes, for example, a flash memory, a hard disk drive (HDD), or the like. A control program that controls operations of a substrate processing apparatus, a process recipe in which sequences, conditions, and the like of substrate processing are written, and the like are readably stored in the memory 121c. The process recipe is configured to cause the controller 121 to execute each sequence in the substrate processing process to obtain a predetermined result, and apparatus data generated by operating the respective components constituting the apparatus when a sequence recipe including the process recipe is executed are stored in the memory 121c. Time data is added to the apparatus data by a time stamp function of the controller 121.

Further, the memory 121c stores control program and the like according to the embodiments of the present disclosure. The CPU 121a is configured to execute the program and the like according to an input of an operation command from the input/output device 150 or the like. Further, the memory 121c stores programs that realizes various flow charts of a substrate processing sequence, a job, and the like in the embodiments of the present disclosure, various setting parameters used when these programs are executed, and a screen file including various setting screen files.

When the term "program" is used herein, it may indicate a case of including the process recipe alone, a case of including the control program alone, or a case of including both the process recipe and the control program.

The I/O port 121d is connected to the respective mechanisms 151 and various sensors 152 of the substrate processing apparatus.

The CPU 121a is configured to read the control program and the like from the memory 121c and execute the same, and also reads the process recipe from the memory 121c according to an input of an operation from the input/output device 150. The CPU 121a is configured to control, according to the contents of the process recipe thus read, for example, a flow rate regulating operation of various types of gases to the process furnace 202 by mass flow controllers, a pressure regulating operation in the process furnace 202 by an opening and closing operation of a valve and the like based on a pressure sensor, a temperature regulating operation of the process furnace 202 based on a temperature sensor, an operation of rotating the boat 217 and adjusting a rotation speed of the boat 217 with a boat rotation mechanism, an operation of raising and lowering the boat 217 with the boat elevator, and the like, via the I/O port 121d.

(2-Position Transfer)

Figure 4:
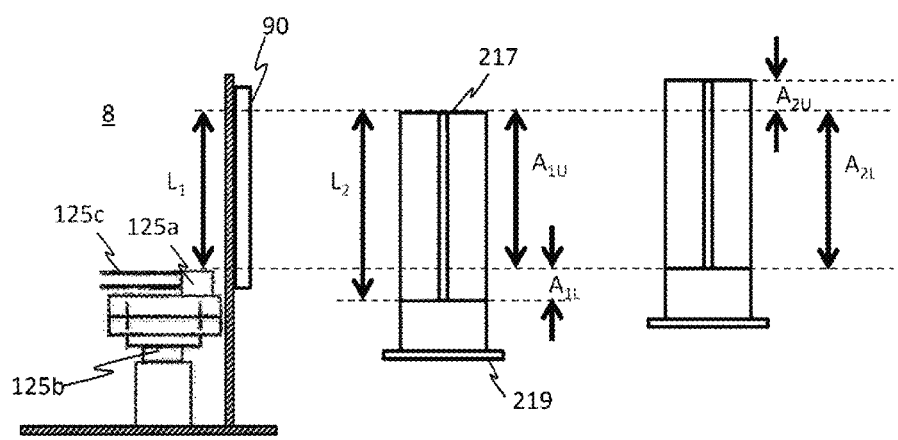
FIG. 4 is a schematic diagram showing a positional relationship between a wafer transfer mechanism and a boat at positions HOME1 and HOME2 of a boat elevator.

Hereinafter, a method of transferring a wafer between the wafer transfer mechanism 125 and the boat 217 will be described. FIG. 4 is a schematic view showing a positional relationship between the wafer transfer mechanism 125 and the boat 217 at positions HOME1 and HOME2 of the boat elevator. In the substrate processing apparatus of the embodiments of the present disclosure, there is a relationship of $L_1 < L_2$ between a stroke (a range in which the end effector 125c may move in the vertical direction to transfer a substrate) $L_1$ of the wafer transfer mechanism 125 in the vertical direction and a wafer holding range $L_2$ of the boat 217. Therefore, when the wafer transfer mechanism 125 loads and unloads the wafer into and from the boat 217, the boat elevator is set to take a plurality of positions. For example, it is assumed to take two positions, that is, a first position (HOME1) and a second position (HOME2). In the first position, an upper area $A_{1U}$ is a transferrable area, and a lower area $A_{1L}$ is a non-transferrable area. Further, in the second position, an upper area $A_{2U}$ is a non-transferrable area, and a lower area $A_{2L}$ is a transferrable area. A boundary between the transferrable area and the non-transferrable area is determined by the strokes of the gate door 90 and the wafer transfer mechanism 125. In this way, in any position, there is a wafer non-transferrable area at the upper end or the lower end of the boat 217. Therefore, when the wafer is loaded into the boat 217, the boat elevator may have to be moved between the first position and the second position, and a time of wafer transfer between the wafer transfer mechanism 125 and the boat 217 can be shortened as the number of the movements can be reduced, thereby improving a throughput of the apparatus.

Therefore, in the embodiments of the present disclosure, the wafer transfer areas in the first position and the second position are set as shown in FIG. 5. In this example, the boat 217 includes slots such that 53 wafers can be mounted thereon, and the slots are identified by numbers assigned from 1 to 53 in this order from bottom (also referred to as boat slot numbers). It is assumed that a slot of the boat 217 where the wafer transfer mechanism 125 can transfer the wafer when the boat elevator is located at the first position is referred to as a first position transfer area $A_1$, and a slot of the boat 217 where the wafer transfer mechanism 125 can transfer the wafer when the boat elevator is located at the second position is referred to as a second position transfer area $A_2$. The transfer areas $A_1$ and $A_2$ may be respectively set arbitrarily as long as they do not include the non-transferrable area shown in FIG. 4, but even when the boat elevator is located either at the first position or at the second position HOME2, an area where the wafer transfer mechanism 125 can transfer the wafer (a multi-position transferrable area $A_{12}$) may be set. FIG. 5 shows an example in which the first position transfer area $A_1$ and the second position transfer area $A_2$ are set such that a first position transfer prohibition area matches the lower area $A_{1L}$ (boat slot numbers 1 to 10), a second position transfer prohibition area matches the upper area $A_{2U}$ (boat slot numbers 44 to 53), and the common portion (boat slot numbers 11 to 43) between the upper area $A_{1U}$ and the lower area $A_{2L}$ becomes the multi-position transferrable area $A_{12}$. Further, even when the boat elevator is located at the second position, the furnace opening shutter 147 may be closed without interfering with the boat 217.

(Boat Teaching)

Since the wafer transfer mechanism 125 is a robot that has no feedback or is incomplete, there is a need to teach the wafer transfer mechanism 125 a subtle dimensional difference (machine difference) for each substrate processing apparatus or each boat such that the wafer may be properly transferred to the boat 217. Usually, before the operation of the apparatus, teaching is performed to measure a position and a shape of the boat and calibrate a coordinate system of the wafer transfer mechanism 125. The measurement itself may be performed by the wafer transfer mechanism 125 itself based on a program, which is called auto-teaching or the like. In the embodiments of the present disclosure, since there is a machine difference in a stop position of the boat elevator, it is assumed that the teaching is performed for the first position transfer area $A_1$ and the second position transfer area $A_2$ in the first position (HOME1) and the second position (HOME2) respectively. Specifically, a jig wafer for position detection is mounted in two slots at the upper side and the lower side of the transfer area of the position or HOME2, and a position detection protrusion of the jig wafer is detected to measure the position and shape of the boat. A slot of the boat where the jig wafer is mounted is referred to as a "teaching position." Here, a teaching position in the first position and a teaching position in the second position may be arbitrarily determined, but one teaching position may be shared. The results obtained by placing the jig wafer in the same slot and raising and lowering the boat 217 by the boat elevator, that is, obtained by making measurement at the first position and the second position, will match except for the height if they are well calibrated, and measurement abnormality may be determined.

(Job Registration Process)

Figure 6:
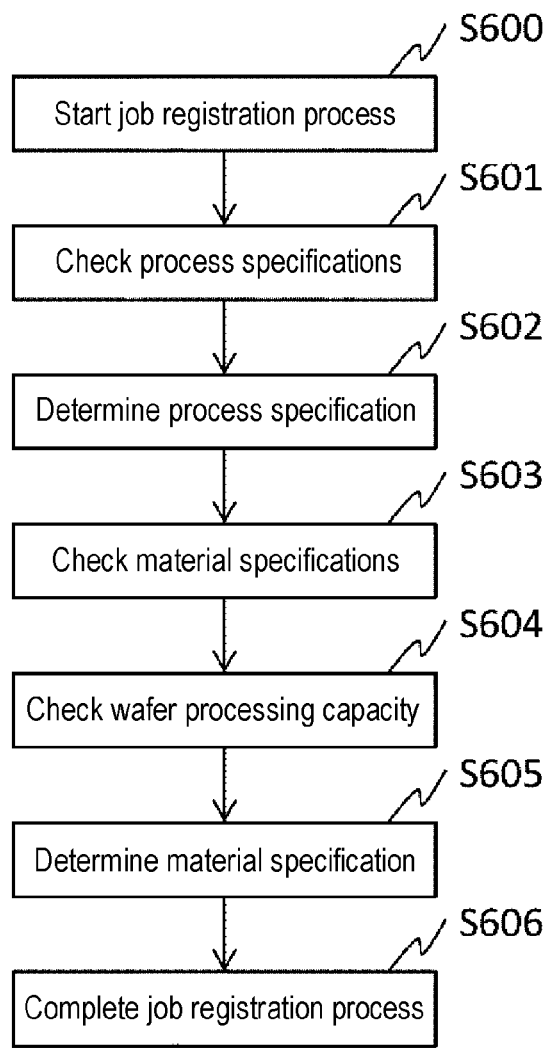
FIG. 6 is a diagram showing a job registration flow.

The process executed by the substrate processing apparatus is registered as a job, and the wafer is processed by executing the job registered in a job queue. FIG. 6 shows a flow in which the job is registered.

The controller 121 receives a film-forming process request from an operator or a customer host computer, and starts a job registration process shown in FIG. 6 at a cycle of 1 second (S600). Information notified in the film-forming process request includes a sequence recipe used at the time of film formation, process parameters corresponding to the sequence recipe, numbers of the carriers 110 holding a product wafer and a monitor wafer to be processed and the holding portions (slots) which are installed in the carrier 110 and on which the wafer 200 is placed, and the like. The carrier slot numbers are added in order from bottom, like the boat 217. The wafer in the carrier 110 is uniquely identified by the carrier slot number. Unless otherwise specified, the controller 121 determines a priority order according to an order of receiving the information notified in the film-forming process request. Further, the wafers held on the same carrier shall be prioritized according to the carrier slot numbers.

The controller 121 checks process specifications. Specifically, the controller 121 checks that the designated recipe is stored in the memory 121c and parameter settings used in the recipe are correct (S601). Subsequently, the controller 121 organizes process specifications for each process module (S602). Specifically, the controller 121 selects a recipe designated this time from the recipes stored in the memory 121c in advance and determines a desired process specification.

Next, the controller 121 checks material specifications (S603). Specifically, the controller 121 checks whether there is a wafer 200 in a carrier 110 that has not been processed and the carrier 110 is not reserved for a process by another job.

Subsequently, the controller 121 checks wafer processing capacity that may be processed by all the process modules PM (S604). Specifically, the controller 121 calculates in advance the number of wafers for each type of wafer to be used, from substrate arrangement parameter (WAP) stored in the memory 121c in advance, to grasp the wafer processing capacity of the process modules PM in advance. WAP is an apparatus parameter that defines wafer arrangement designation on the boat 217.

The controller 121 calculates the total number of wafers to be used in this process, and calculates the number of wafers for each wafer type according to the arrangement of substrates mounted on the boat 217 for all the wafer types to be processed by the substrate processing apparatus.

The controller 121 determines material specification based on the wafer processing capacity of each process module calculated in S604 (S605). Specifically, the controller 121 determines which process module the job is executed in, and in a case where the job is assigned to two process modules, the controller 121 determines which process module a wafer held by which carrier is assigned to.

After registering the job, the controller 121 periodically (for example, every second) monitors presence or absence of a job execution instruction, and when receiving the job execution instruction from a host controller or an operation part, starts executing the received job.

(Wafer Transfer Process)

A job execution process includes a wafer transfer process. The controller 121 sets the arrangement of the wafers 200 on the boat 217 such that the wafer 200 to be subjected to the substrate processing are transferred to the boat 217 of the process module PM being used. Further, an order in which the wafers 200 are transferred is determined from the determined arrangement.

FIG. 7 shows an example of substrate transfer information determined by the controller 121. Column 701 is transfer destination information and shows the boat slot number of the boat 217. Columns 702 and 703 are transfer source information, column 702 shows the type and item number of the carrier 110 in which the wafer 200 is stored, and column 703 shows the carrier slot number of the slot where the wafer 200 is stored in the carrier 110. Column 704 is a transfer order when the wafer transfer mechanism 125 loads and unloads the wafer into and from the boat 217, and values 1 to 53 are registered in the transfer order.

The wafer type of the wafer to be placed in each slot of the boat 217 is defined by WAP. Further, wafers of the same wafer type are stored in one carrier. This example designates that wafers of wafer type "Product," "Monitor," "Dummy," and "Fill Dummy" are arranged on the boat 217. "Product" is a wafer that becomes a product (product wafer). "Monitor" is a monitor wafer to be used to estimate the processing result of the product wafer. The film formation quality inspection is performed on the monitor wafer. "Dummy" is a dummy wafer and "Fill Dummy" is a filling dummy wafer that is arranged so as not to generate an empty slot when the number of input wafers is smaller than the number of wafers that can be processed at one time.

In this example, since a predetermined quality may not be maintained at both end portions (upper end portion and lower end portion) of all the slots (substrate holding area) of the boat 217, mounting of the product wafer is avoided and the dummy wafer ("Dummy") is arranged. Further, the monitor wafers ("Monitor") are arranged at three locations, that is, the central portion (boat slot number 27) and boundaries (boat slot numbers 52 and 2) of both end portions in all the slots. Slots other than these are slots on which the product wafer may be placed.

According to the definition of WAP, the controller 121 determines loading source information of the substrate transfer information. In this example, the filling dummy wafers ("Fill Dummy") are arranged on the upper end side and the lower end side (boat slot numbers 51 to 44 and 9 to 3). The loading source information is determined such that the product wafer ("Product #1": boat slot numbers 43 to 28 and 26 to 18) of carrier 1 and the product wafer ("Product #2": boat slot numbers 17 to 10) from carrier 2 are arranged in the remaining slots. Since the number of product wafers arranged is larger than the number of accommodations in one carrier 110, the product wafers are loaded from a plurality of carriers "Product #1" and "Product #2." Although FIG. 7 shows an example in which the carrier slot starts from 1, in reality, the dummy wafer and the like accommodated in one or more carriers 110 may be used cyclically, and as a result, the carrier of the loading source may span multiple carriers.

When a carrier to be transferred to each slot of the boat 217 and a mounting position in the carrier are specified as shown in FIG. 7, the controller 121 determines the transfer order in which the wafers 200 are transferred. Since the order in which the wafers are loaded into the boat 217 and the order in which the wafers are unloaded from the boat 217 are different from each other, the transfer order is determined for each. The transfer order is determined according to the wafer type to suppress an influence of particles on the product wafer at the time of transfer of the wafers 200. From this point of view, the dummy wafer, the filling dummy wafer, the product wafer, and the monitor wafer may have to be transferred in this order to the boat 217 at the time of loading. The unloading order may have to be reverse to the loading order such that the monitor wafer, the product wafer, the filling dummy wafer, and the dummy wafer are transferred in this order.

At this time, since the boat 217 includes the multi-position transferrable area $A_{12}$, the controller 121 may have to determine whether the position of the boat elevator at the time of transfer is the first position HOME1 or the second position HOME2. Here, the controller 121 determines the transfer order to minimize the number of position shifts of the boat elevator. This is because the transfer time of the transfer between the wafer 200 and the boat 217 may be shortened as the number of the shifts is reduced.

FIG. 8 shows an example of the transfer order determined by the controller 121 when the transfer between the carrier 110 and the boat 217 is the substrate transfer information shown in FIG. 7. Table 801 shows the boat slot number (No.) of the boat 217, whether or not it is possible to perform the transfer to the pertinent slot at the first position (HOME1) (H1), whether or not it is possible to perform the transfer to the pertinent slot at the second position (HOME2) (H2), and the wafer type of a wafer to be transferred to the pertinent slot. In this case, Table 802 shows an example of the transfer order when the wafer 200 determined by the controller 121 is loaded into the boat 217, and Table 803 shows an example of the transfer order when the wafer 200 is unloaded from the boat 217.

The transfer order when the wafers 200 are loaded into the boat 217 will be described. The wafers are loaded such that the dummy wafer, the filling dummy wafer, the product wafer, and the monitor wafer in this order are loaded, and when there are a plurality of wafers of the same wafer type, the loading is performed starting from the slot on the upper side (that is, from a slot having a large boat slot number) in order. In this example, slots into which the dummy wafer and the filling dummy wafer are to be loaded include a slot for which the loading is performed only at the first position and a slot for which the loading is performed only at the second position respectively. It is assumed that the boat elevator is at the first position when the substrate processing apparatus is on standby.

Therefore, the dummy wafer is loaded into the slot of the boat slot number 53 while the boat elevator is not moved, and then the boat elevator is shifted to the second position to load the dummy wafer into the slot of the boat slot number 1. In this way, the shift operation of the boat elevator occurs once to perform the loading of the dummy wafer. Next, the transfer of the fill dummy wafers is performed. As the loading of the fill dummy wafers is performed starting from the slot on the upper side in order, the boat elevator is shifted to the first position to load the fill dummy wafers into the boat slot numbers 51 to 44, and then the boat elevator is shifted to the second position to load the fill dummy wafers into the boat slot numbers 9 to 3. In this way, the shift operation of the boat elevator occurs twice to perform the loading of the fill dummy wafers. Then, the transfer of the product 1 wafers and the product 2 wafers are performed. Since the boat elevator is in the second position, the slot numbers 43 to 28, 26 to 10 where the product 1 wafers and product 2 wafers loaded are accessible; and thus, the boat elevator is not moved. Subsequently, the transfer of the monitor wafers are performed. The boat elevator is shifted to the first position to load the monitor wafers into the slot numbers 52 and 27.

Thereafter, the boat elevator is shifted to the second position to load the monitor wafer into the slot number 2. In this way, the transition operation of the boat elevator occurs twice in order to carry the monitor wafers. Thus, in this embodiment, the boat elevator is shifted between the first and second positions a total of 5 times during the wafer loading process. Table 802 summarizes the wafer transfer operation to the boat 217 as follows. The "transfer order" column indicates a timing of the shift operation by an arrow when the shift operation of the boat elevator occurs, in addition to the boat slot number of the slot for which the loading is performed. Further, "the number of operations" column indicates the number of shift operations of the boat elevator to load the wafer of each wafer type.

Here, an area where the product 1 wafer ("Product 1") is stored is included in the multi-position transferrable area $A_{12}$. Therefore, since the boat elevator is located at the second position at the end of the loading of the filling dummy wafer, the loading of the product 1 wafer into the boat 217 continues, as it is. Further, an area in which the product 2 wafer ("Product 2") is stored includes both the multi-position transferrable area $A_{12}$ and the first position transfer prohibition area. However, since the boat elevator is located at the second position HOME2 at the end of the loading of the product 1 wafer, the loading of the product 2 wafer into the boat 217 continues, as it is, and as a result, the shift operation of the boat elevator did not occur to perform the loading of the product wafer. In this way, it is understood that the number of position shifts in the entire wafer loading may be minimized by local optimization of maintaining the current position, in other words, delaying the shift as much as possible, when transferring the wafer to the multi-position transferrable area $A_{12}$. In a case where the pod 110 of the loading source is not provided in the pod opener 21, the transfer may be interrupted. In a case where the interruption occurs during the transfer to the multi-position transferrable area $A_{12}$, the position shift may be performed during the interruption.

When the process in the substrate processing apparatus is completed, the wafers mounted on the boat 217 are detected by a sensor of the wafer transfer mechanism 125 to check the existence of wafer or presence or absence of an abnormality such as cracking (boat mapping). At this time, referring to the substrate transfer information shown in FIG. 7, it is determined whether or not the wafer can be unloaded for each wafer type. The boat mapping is performed at each of the first position and the second position of the boat elevator, and the wafer to be mapped is the same as the wafer to be unloaded at that position. Also in the boat mapping, detections may be performed by overlapping in at least one slot at the first position and the second position. The detection results should be the same, but if they are different, it may help isolate the cause of a failure.

The transfer order when the wafer 200 is unloaded from the boat 217 will be described. The unloading order is reverse to the loading order. That is, the wafers are unloaded such that the monitor wafer, the product wafer, the filling dummy wafer, and the dummy wafer in this order are unloaded, and when there are a plurality of wafers of the same wafer type, the loading is performed starting from the lower slot (that is, from a slot having a small boat slot number) in order. First, the unloading of the monitor wafers is performed. In this performance, the boat elevator is shifted from the first position to the second position to unload the monitor wafer from the slot of the boat slot number 2, and then the boat elevator is shifted to the first position to load the monitor wafer into the slot in the order of the boat slot numbers 27 and 52. In this way, the shift operation of the boat elevator occurs twice to unload the monitor wafers. Then, the unloading of the product 2 wafers is performed. Since the boat elevator is in the first position, the boat elevator is shifted to the second position to unload the product 2 wafer from the slots of the boat slot numbers 10 to 17. Then, the unloading of the product 1 wafers is performed. Since the boat elevator is in the second position, the slot numbers 18 to 26 and 28 to 43 where the product 1 wafers to be unloaded are accessible; and thus, the boat elevator is not moved. In this way, the shift operation of the boat elevator occurs once to unload the product wafers. Next, the transfer of the fill dummy wafers is performed. The fill dummy wafers are unloaded from the slots of the boat slot numbers 3 to 9, and then the boat elevator is shifted to the first position to unload the fill dummy wafers from the slots of the boat slot numbers 44-51. In this way, the shift operation of the boat elevator occurs once to perform the loading of the fill dummy wafer. Subsequently, the transfer of the dummy wafers are performed. The boat elevator is shifted to the first position to unload the dummy wafer from the slot of the boat slot number 1, and then the boat elevator is shifted to the second position to unload the dummy wafer from the slot of the boat slot number 53. In this way, the transition operation of the boat elevator occurs twice in order to carry the dummy wafer. Thus, in this embodiment, the boat elevator is shifted between the first and second positions a total of 6 times during the wafer unloading process. Table 803 summarizes the wafer unloading operation from the boat 217 as follows.

In the embodiments of the present disclosure, by providing the multi-position transferrable area $A_{12}$, it is possible to reduce the shift operation of the boat elevator in the transfer operation between the carrier 110 and the boat 217. FIG. 9 shows, as a comparative example, an example of the transfer order determined by the controller 121 when the multi-position transferrable area $A_{12}$ is not provided. Also in the case of the comparative example, the transfer target is indicated by the substrate transfer information shown in FIG. 7. As shown in the column of transferability (H1) to the pertinent slot at the first position and the column of transferability (H2) to the pertinent slot at the second position in Table 901, the multi-position transferrable area $A_{12}$ does not exist. Therefore, when comparing the transfer order (Table 802) when the wafer 200 is loaded into the boat 217 in the embodiments of the present disclosure and the transfer order (Table 902) when the wafer 200 is loaded into the boat 217 in the comparative example, they differ from each other in the following points.

As described above, in the embodiments of the present disclosure, the shift operation of the boat elevator does not occur when the product wafer is loaded. On the other hand, in the comparative example, since the boat elevator is located at the second position at the end of the loading of the filling dummy wafer, the boat elevator has to be shifted to the first position to load the product 1 wafer into the boat 217. Subsequently, the product 2 wafer is loaded into the boat 217, but since the slot of the slot number 10 is a slot for which the loading may be performed only at the second position, the boat elevator has to be shifted to the second position when the product 2 wafer is loaded into the slot number 10. In this way, even when the wafer is loaded into the boat 217 based on the same substrate transfer information, the number of transitions of the boat elevator increases. The same applies to the wafer unloading operation.

Figure 10:
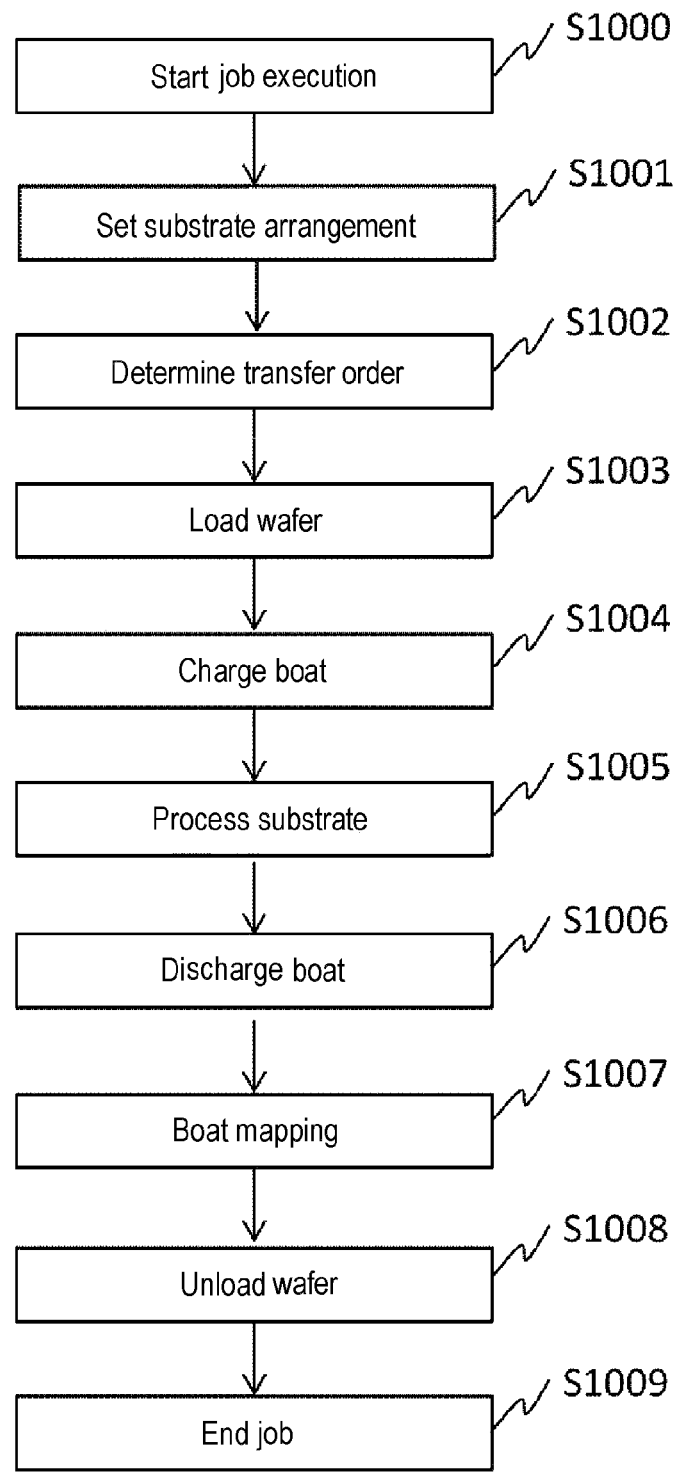
FIG. 10 is a diagram showing a job execution flow.

FIG. 10 summarizes a flow of job execution process. As described above, when the job execution instruction is received, the job execution is started (S1000). Subsequently, the controller 121 sets the substrate transfer information (see FIG. 7) based on the process recipe of the job and the substrate arrangement parameters associated with the process recipe (S1001), and determines the transfer order (S1002). At this time, transfer operation data that coordinates and controls the wafer transfer mechanism and the boat elevator are created such that the number of shifts of the boat elevator is minimized by using the multi-position transferrable area $A_{12}$.

According to the transfer operation data, the wafer transfer mechanism 125 loads the wafer 200 into the boat 217 (S1004). At this time, when the wafer is loaded or unloaded between the wafer transfer mechanism 125 and the boat 217, in a case where the boat elevator is located at a position other than the first position or the second position (for example, during position shift), the controller 121 performs an interlock to forcibly prohibit the transfer operation of the wafer transfer mechanism 125 to prevent damage to the wafer 200. Further, even in such a position, the transfer to the slot of the transfer prohibition area may be prohibited by the interlock. Thus, damage may be avoided even in a case where the substrate transfer information is incorrect. Further, in a case where the upper end of the boat 217 located at the second position may collide with the furnace opening shutter 147, the controller 121 may control the furnace opening shutter 147 together with the boat elevator to open the furnace opening shutter 147 when the boat elevator is shifted to the second position. On the other hand, when the boat elevator is located at the first position, the furnace opening shutter 147 may be basically closed to suppress a change in temperature of the process furnace 202, but in a case where the boat elevator is shifted from the second position to the first position and shifted again to the second position within a time shorter than a predetermined time, the furnace opening shutter 147 may be left open even while the boat elevator is located at the first position to avoid frequently opening and closing of the furnace opening shutter 147.

The boat 217 on which the wafers 200 are mounted is charged into the process furnace 202 (S1004), and a film-forming process is executed on the wafers according to the process recipe (S1005). Then, the boat is discharged from the process furnace 202 (S1006), and the boat mapping is performed while the wafers are being cooled (S1007). Then, the wafers 200 are unloaded from the boat 217 (S1008), and the job is completed (S1009).

EMBODIMENTS OF THE PRESENT DISCLOSURE

The technique of the present disclosure is not limited to setting two positions for the boat elevator, but may also be applied to an apparatus where three or more positions are set. In that case, a shift time from one position to other plural positions may be different, and the shift time may be different between raising and lowering of boat elevator. Therefore, a target of minimization may be the number of shifts or a total time taken during the shifts among three or more positions, or the number of shifts or the total time between two positions of interest, among three or more positions.

According to the present disclosure in some embodiments, it is possible to provide a technique capable of efficiently loading and unloading a wafer into and from a boat.

While certain embodiments of the present disclosure have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A substrate processing apparatus comprising:
a boat including a plurality of slots configured to hold substrates;
a process furnace configured to process the substrates held in the boat;
a boat elevator configured to raise and lower the boat;
a transfer arm configured to transfer the substrates between a plurality of carriers in which the substrates to be stored and the boat; and
a controller configured to be capable of controlling the boat elevator and the transfer arm,
wherein the controller is configured to set a plurality of positions of the boat elevator at which the transfer arm respectively transfers at least two of the substrates, and perform a selection of the plurality of positions to minimize a number of shifts among the plurality of positions of the boat elevator or a total time taken during the shifts in each of an operation of the transfer arm to load the substrates into the boat from the plurality of carriers until the substrates are loadable into the process furnace and an operation of the transfer arm to unload the substrates processed in the process furnace from the boat to the plurality of carriers,
wherein the boat includes the slots formed over a range wider than a range in which the substrates are transferrable to the boat in one of the plurality of positions,
wherein the plurality of positions include a first position and a second position,
wherein the boat comprises a first area including slots that can only be accessed by the transfer arm when the boat is in the first position, a second area including slots that can only be accessed by the transfer arm when the boat is in the second position, and a third area including slots that can be accessed by the transfer arm when the boat elevator is in the first position and when the boat elevator is in the second position,
wherein the first area and the third area constitute a first position transfer area, and the second area and the third area constitute a second position transfer area,
wherein the section of the plurality of positions is applied to an operation of loading the substrates and an operation of unloading the substrates with respect to the slots in which the substrates are transferrable using any of the first position and the second position, and
wherein when the boat elevator is located in the first position, the transfer arm is raised or lowered and transfers a plurality of substrates among the substrates to the first position transfer area; and then, when the boat elevator is moved to be located in the second position, the transfer arm is raised or lowered and transfers a plurality of other substrates among the substrates to the second position transfer area.

2. The substrate processing apparatus of claim 1, wherein when the boat elevator is in the first position, the transfer arm is accessible to an uppermost slot of the boat; and when the boat elevator is in the second position, the transfer arm is accessible to a lowest slot of the boat;
wherein the controller starts the operation of loading at the first position and starts the operation of unloading at the second position.

3. The substrate processing apparatus of claim 1, comprising:
a partition wall configured to separate a charging chamber in which the boat is raised and lowered and a transfer chamber in which the transfer arm is installed; and
a gate door installed at the partition wall and configured to be opened to a portion of the plurality of slots of the boat mounted on the boat elevator which takes the first position or the second position,
wherein the range in which the substrates are transferrable is limited by a movable range of the transfer arm or the opening of the gate door.

4. The substrate processing apparatus of claim 1, wherein the substrates include plural types of substrates, and the plural types of substrates are held in the boat,
- wherein when the boat elevator is in the first position, the transfer arm is accessible to an uppermost slot of the boat; and when the boat elevator is in the second position, the transfer arm is accessible to a lowest slot of the boat;
- wherein the controller is configured to be capable of controlling the transfer arm such that the substrates are mounted in the plurality of slots of the boat sequentially in order from top to bottom and the substrates are discharged from the plurality of slots of the boat sequentially in order from bottom to top, for each of the types of substrates, and
- wherein at least one selected from the group of the plural types of substrates is a dummy substrate unevenly arranged in slots at the sides of an upper end and a lower end of the boat.

5. The substrate processing apparatus of claim 4, wherein the plural types of substrates further include a product substrate, a fill-dummy substrate and a monitor substrate, and
- wherein the controller is configured to be capable of controlling the transfer arm to mount the substrates including dummy substrates, fill-dummy substrates, product substrates and monitor substrates in that order within 5 times of shifts between the first position and the second position and to discharge the substrates including the monitor substrates, product substrates, the fill-dummy substrates and the dummy substrates in that order within 6 times of shifts between the first position and the second position.

6. The substrate processing apparatus of claim 4, comprising: a memory configured to store a substrate arrangement parameter including the types of substrates mounted in the plurality of slots of the boat,
- wherein the controller is configured to be capable of determining substrate transfer information to set a carrier that is a loading and unloading source of the substrates mounted in the plurality of slots of the boat, a holding area of the substrates in the carrier, and a loading and unloading order of the substrates, according to a definition of the substrate arrangement parameter, and creating transfer operation data that coordinates and controls the transfer arm and the boat elevator based on the substrate transfer information, and
- wherein the transfer operation data is set to minimize the number of position shifts of the boat elevator when the substrates are loaded and unloaded.

7. The substrate processing apparatus of claim 6, wherein the controller is configured to be capable of performing boat mapping on the substrates on the boat based on the substrate transfer information before the substrates are unloaded from the boat, and
- wherein a position of the boat elevator when the boat mapping is performed is selected from the first position and the second position.

8. The substrate processing apparatus of claim 6, wherein the controller is configured to prohibit a transfer operation of the transfer arm when the boat elevator is located at a position other than a position set such that the transfer arm transfers the substrates.

9. The substrate processing apparatus of claim 1, wherein in the second position, the transfer arm is capable of transferring the substrates to a slot at a lowest end of the boat, and a furnace opening shutter of the process furnace is not closable by interfering with the boat or prohibited from being closed,
- wherein the substrates include a plurality of substrates and
- wherein when the substrates are shifted from the second position to the first position during a series of transfers of the substrates and a holding time taken until the substrates are again shifted to the second position is shorter than a predetermined time, the controller is configured to be capable of controlling the furnace opening shutter with the furnace opening shutter being opened during the holding time.

10. The substrate processing apparatus of claim 1, comprising:
- a plurality of process modules, each including the process furnace and a charging chamber in which the boat is raised and lowered;
- a transfer chamber that is installed in common for the plurality of process modules and in which the transfer arm is installed; and
- a plurality of pod openers that are connected to the transfer chamber and configured to hold the carriers while the carriers are being opened to the transfer arm such that the transfer arm is accessible to the carriers,
- wherein the plurality of process modules are configured such that the substrates are accessible to the plurality of process modules and the carriers via the transfer chamber.

11. The substrate processing apparatus of claim 10, comprising: a plurality of gate doors installed at a partition wall that separates the charging chamber and the transfer chamber,
- wherein the plurality of process modules are arranged in a horizontal direction,
- wherein the plurality of gate doors are arranged in the horizontal direction in a corresponding manner with the plurality of process modules, and at least one gate door selected from the group of the plurality of gate doors slides up or down to be opened or closed, and
- wherein the charging chamber has a height that is at least twice a height of the at least one gate door that slides up or down.

12. The substrate processing apparatus of claim 1, wherein in the second position, the transfer arm is capable of transferring the substrates to a slot at a lowest end of the boat, and a furnace opening shutter of the process furnace is closable without interfering with the boat.

13. The substrate processing apparatus of claim 1, comprising:
- a plurality of process modules, each including the process furnace and a charging chamber in which the boat is raised and lowered;
- a transfer chamber that is installed in common for the plurality of process modules and in which the transfer arm is installed;
- a plurality of pod openers that are connected to the transfer chamber and configured to hold the carriers while the carriers are being opened to the transfer arm such that the transfer arm is accessible to the carriers; and
- a plurality of gate doors installed at a partition wall that separates the charging chamber and the transfer chamber,
- wherein the plurality of process modules are configured such that the substrates are accessible to the plurality of process modules and the carriers via the transfer chamber, wherein the plurality of process modules are arranged in a horizontal direction, wherein the plurality of gate doors are arranged in the horizontal direction in a corresponding manner with the plurality of process modules, and at least one gate door selected from the group of the plurality of gate doors slides up or down to be opened or closed, and wherein the charging chamber has a height that is at least twice a height of the at least one gate door that slides up or down.

14. The substrate processing apparatus of claim 1, comprising: a memory configured to store a substrate arrangement parameter including plural types of substrates mounted in the plurality of slots of the boat, wherein the controller is configured to be capable of determining substrate transfer information to set a carrier that is a loading and unloading source of the substrates mounted in the plurality of slots of the boat, a holding area of the substrates in the carrier, and a loading and unloading order of the substrates, according to a definition of the substrate arrangement parameter, and creating transfer operation data that coordinates and controls the transfer arm and the boat elevator based on the substrate transfer information, and wherein the transfer operation data is set to minimize the number of position shifts of the boat elevator when the substrates are loaded and unloaded.

15. The substrate processing apparatus of claim 14, wherein the controller is configured to prohibit a transfer operation of the transfer arm when the boat elevator is located at a position other than a position set such that the transfer arm transfers the substrates.

16. The substrate processing apparatus of claim 14, wherein the controller is configured to be capable of performing boat mapping on the substrates on the boat based on the substrate transfer information before the substrates are unloaded from the boat, and wherein a position of the boat elevator when the boat mapping is performed is executed by a position when the substrates are unloaded.

17. The substrate processing apparatus of claim 1, further comprising a sensor installed near the transfer arm to detect the substrates loaded in the boat, wherein when the boat elevator is in the first position, the transfer arm is accessible to an uppermost slot of the boat; and when the boat elevator is in the second position, the transfer arm is accessible to a lowest slot of the boat;

wherein the controller is configured to be capable of performing boat mapping across the slots by shifting positions among the first position and the second position.

18. The substrate processing apparatus of claim 17, wherein the controller performs the boat mapping in an order from the first position to the second position.

19. A method of manufacturing a semiconductor device by using a substrate processing apparatus including a process furnace configured to process substrates that are held in a boat including a plurality of slots and on which the semiconductor device is formed, a boat elevator configured to raise and lower the boat, a transfer arm configured to transfer the substrates between a carrier in which the substrates are stored and the boat, and a controller configured to be capable of controlling the boat elevator and the transfer arm, comprising:

creating transfer operation data by the controller, the transfer operation data coordinating and controlling the transfer arm and the boat elevator based on substrate transfer information to set a carrier that is a loading and unloading source of the substrates mounted in the plurality of slots of the boat, a holding area of the substrates in the carrier, and a loading and unloading order of the substrates;

loading the substrates into the boat based on the transfer operation data by the transfer arm and the boat elevator, and inserting the boat loaded with the substrates into a process furnace by the boat elevator;

performing a predetermined process on the substrates by the process furnace, and drawing out the boat holding the substrates for which the predetermined process has been completed, from the process furnace by the boat elevator; and unloading the substrates from the boat based on the transfer operation data by the transfer arm and the boat elevator, wherein the boat includes the slots formed over a range wider than a range in which the substrates are transferrable to the boat, which is stationary, wherein the act of loading the substrates and the act of unloading the substrates are performed between the transfer arm and the boat elevator that has shifted to a first position or a second position, wherein in the transfer operation data, a position of the boat elevator for performing the act of loading the substrates and the act of unloading the substrates, with respect to the slots in which the substrates are transferrable using any of the first position and the second position, is set to minimize the number of position shifts of the boat elevator or a total time taken during the shifts when the substrates are loaded and unloaded, wherein the boat comprises a first area including slots that can only be accessed by the transfer arm when the boat is in the first position, a second area including slots that can only be accessed by the transfer arm when the boat is in the second position, and a third area including slots that can be accessed by the transfer arm when the boat elevator is in the first position and when the boat elevator is in the second position, wherein the first area and the third area constitute a first position transfer area, and the second area and the third area constitute a second position transfer area, wherein the section of the plurality of positions is applied to an operation of loading the substrates and an operation of unloading the substrates with respect to the slots in which the substrates are transferrable using any of the first position and the second position, and wherein when the boat elevator is located in the first position, the transfer arm is raised or lowered and transfers a plurality of substrates among the substrates to the first position transfer area; and then, when the boat elevator is moved to be located in the second position, the transfer arm is raised or lowered and transfers a plurality of other substrates among the substrates to the second position transfer area.

* * * * *